US010726864B1

(12) United States Patent
Nguyen

(10) Patent No.: US 10,726,864 B1
(45) Date of Patent: Jul. 28, 2020

(54) DATA STORAGE DEVICE COMPRISING PRINTED CIRCUIT BOARD INSTALLED ALONG ARC OF DISK SHROUD

(71) Applicant: Western Digital Technologies, Inc., San Jose, CA (US)

(72) Inventor: Jack T. Nguyen, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/691,902

(22) Filed: Nov. 22, 2019

(51) Int. Cl.
*G11B 5/10* (2006.01)
*G11B 5/012* (2006.01)
*H05K 1/11* (2006.01)
*G11B 5/127* (2006.01)

(52) U.S. Cl.
CPC ............... *G11B 5/012* (2013.01); *G11B 5/10* (2013.01); *G11B 5/127* (2013.01); *H05K 1/118* (2013.01); *H05K 2201/09018* (2013.01)

(58) Field of Classification Search
CPC ........... G11B 5/012; G11B 5/10; G11B 5/127; H05K 1/118; H05K 2201/09018
USPC .............................................. 360/99.2–99.24
See application file for complete search history.

(56) References Cited

U.S. PATENT DOCUMENTS

| 4,654,738 A * | 3/1987 | Kato .................... G11B 5/531 360/130.24 |
| 4,814,913 A * | 3/1989 | Mihara ................ G11B 33/121 360/78.12 |
| 5,204,806 A | 4/1993 | Sasaki et al. |
| 5,434,362 A | 7/1995 | Klosowiak et al. |
| 5,499,161 A | 3/1996 | Hosseinzadeh et al. |
| 5,566,036 A * | 10/1996 | Kang .................... G11B 25/063 360/88 |
| 5,717,541 A * | 2/1998 | Ycas ...................... G11B 21/02 360/264.2 |
| 5,917,795 A * | 6/1999 | Furukawa ............. G11B 33/121 360/99.06 |
| 6,865,055 B1 | 3/2005 | Ou-Yang et al. |
| 7,070,421 B2 * | 7/2006 | Nozaki ................. G11B 25/043 360/245.8 |
| 7,443,678 B2 | 10/2008 | Han et al. |
| 9,007,756 B2 * | 4/2015 | Kuo ......................... H05K 5/02 349/58 |
| 9,489,971 B1 | 11/2016 | Klarqvist et al. |
| 9,661,743 B1 | 5/2017 | Bergman et al. |
| 2003/0177639 A1 | 9/2003 | Berg |
| 2007/0097552 A1 * | 5/2007 | Lee ....................... G11B 5/4846 360/245.9 |
| 2008/0014768 A1 | 1/2008 | Lee et al. |
| 2008/0089124 A1 * | 4/2008 | Nguyen ................ G11B 33/121 365/185.04 |

(Continued)

FOREIGN PATENT DOCUMENTS

| EP | 2549246 A1 * | 1/2013 |
| JP | 05089650 A * | 4/1993 |

*Primary Examiner* — Allen T Cao

(57) ABSTRACT

A data storage device is disclosed comprising a base casting forming a housing, wherein components within the housing comprise a first disk, a first head, and a first printed circuit board (PCB) being curved to substantially follow an arc of a first part of a shroud that surrounds at least part of the first disk. The first PCB has mounted thereon a first integrated circuit comprising a first microprocessor configured to actuate the first head over the first disk in order to access the first disk.

20 Claims, 9 Drawing Sheets

(56) References Cited

U.S. PATENT DOCUMENTS

| | | | |
|---|---|---|---|
| 2008/0143610 A1* | 6/2008 | Wang | H01Q 9/0421 343/702 |
| 2010/0067357 A1* | 3/2010 | Huang | G11B 5/59627 369/247.1 |
| 2013/0021165 A1* | 1/2013 | Stokes | G01H 1/00 340/850 |
| 2017/0118838 A1 | 4/2017 | Williams et al. | |

\* cited by examiner

DATA STORAGE DEVICE COMPRISING PRINTED CIRCUIT BOARD INSTALLED ALONG ARC OF DISK SHROUD

BACKGROUND

Data storage devices such as disk drives comprise a disk and a head connected to a distal end of an actuator arm which is rotated about a pivot by a voice coil motor (VCM) to position the head radially over the disk. The disk comprises a plurality of radially spaced, concentric tracks for recording user data sectors and servo sectors. The servo sectors comprise head positioning information (e.g., a track address) which is read by the head and processed by a servo control system to control the actuator arm as it seeks from track to track.

Conventional disk drives typically comprise a rigid printed circuit board (PCB) 2 that is mounted to an external surface 4 of a base casting (FIG. 1) housing the VCM, actuator arm assembly, and disks. The PCB 2 is populated with a number of integrated circuits, such as circuitry for controlling operation of the disk drive, power circuitry for power regulation and servo motor control, circuitry and connectors for interfacing with a host, passive components such as resistors, diodes, capacitors, etc. In attempt to increase the capacity and throughput of a disk drive, the number of disks installed into the base casting is increasing, as is the number of communication channels that may be accessing two or more disk surfaces concurrently. For example, a disk drive may employ a split actuator configuration wherein multiple subsets of actuator arms are independently actuated by respective VCMs in order to enable the concurrent access of multiple disk surfaces. As the number of disks and/or communication channels increases, there is a commensurate increase in the PCB 2 footprint due to a corresponding increase in the number and/or size of the integrated circuits that populate the PCB 2.

DETAILED DESCRIPTION

Figure 2A:
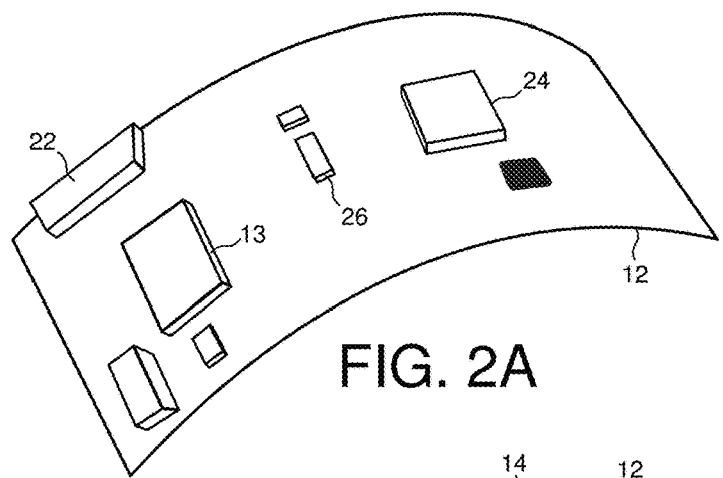
FIGS. 2A and 2B show an embodiment wherein a first printed circuit board (PCB) is curved to substantially follow an arc of a first part of a shroud that surrounds at least part of the first disk, wherein the first PCB having mounted thereon a first integrated circuit comprising a first microprocessor configured to actuate the first head over the first disk in order to access the first disk.
Figure 2B:
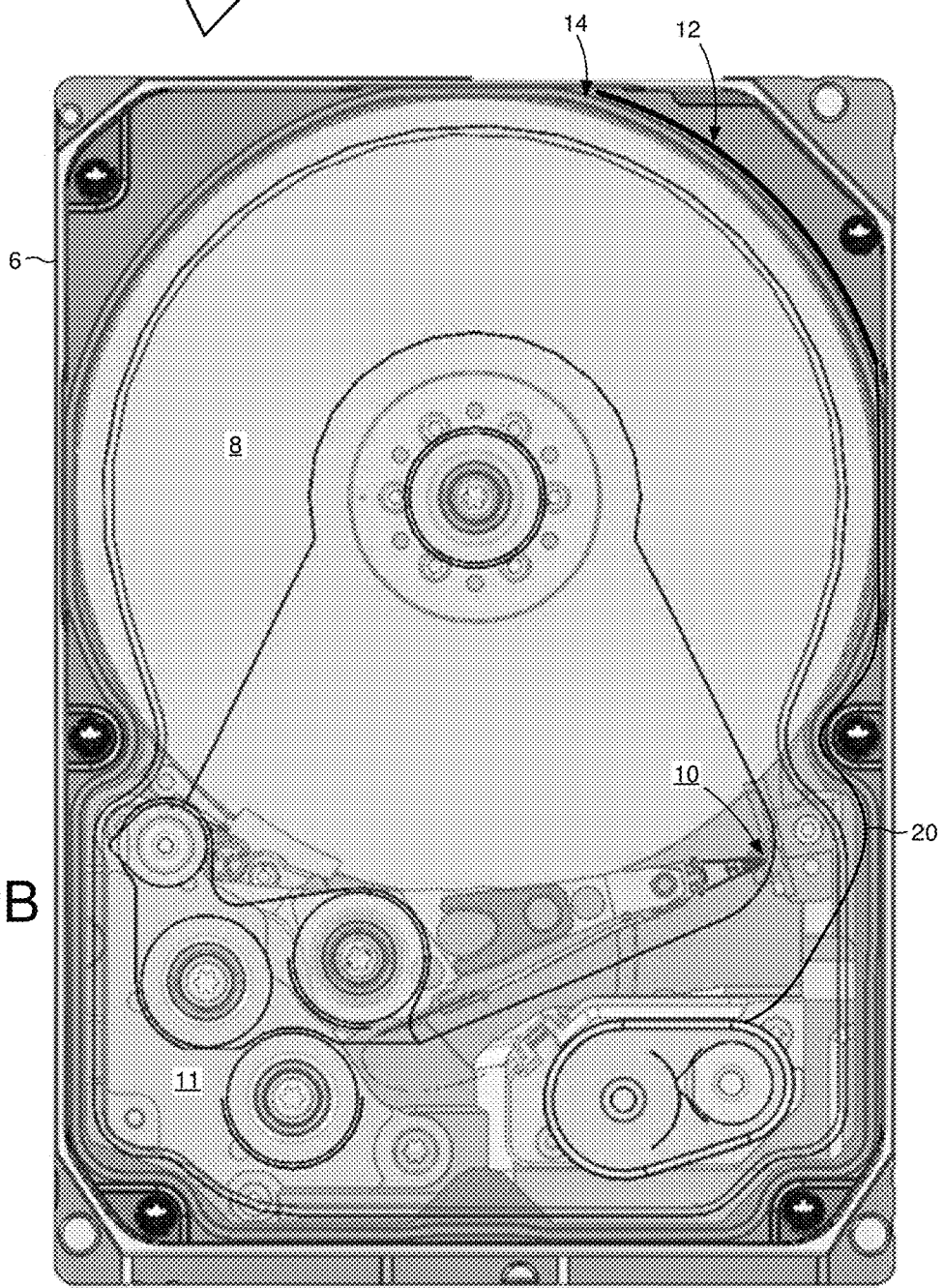

FIGS. 2A and 2B show data storage device in the form of a disk drive according to an embodiment comprising a base casting forming a housing 6, wherein components within the housing 6 comprise a first disk 8, a first head 10, and a first printed circuit board (PCB) 12 being curved to substantially follow an arc of a first part of a shroud 14 that surrounds at least part of the first disk 8. The first PCB 12 has mounted thereon a first integrated circuit 13 comprising a first microprocessor configured to actuate the first head 10 over the first disk 8 in order to access the first disk 8. FIG. 2B shows a plan top view looking down into the disk drive housing 6 with the top cover removed and showing the first curved PCB 12 installed in an upper right corner of the housing 6.

Figure 1:
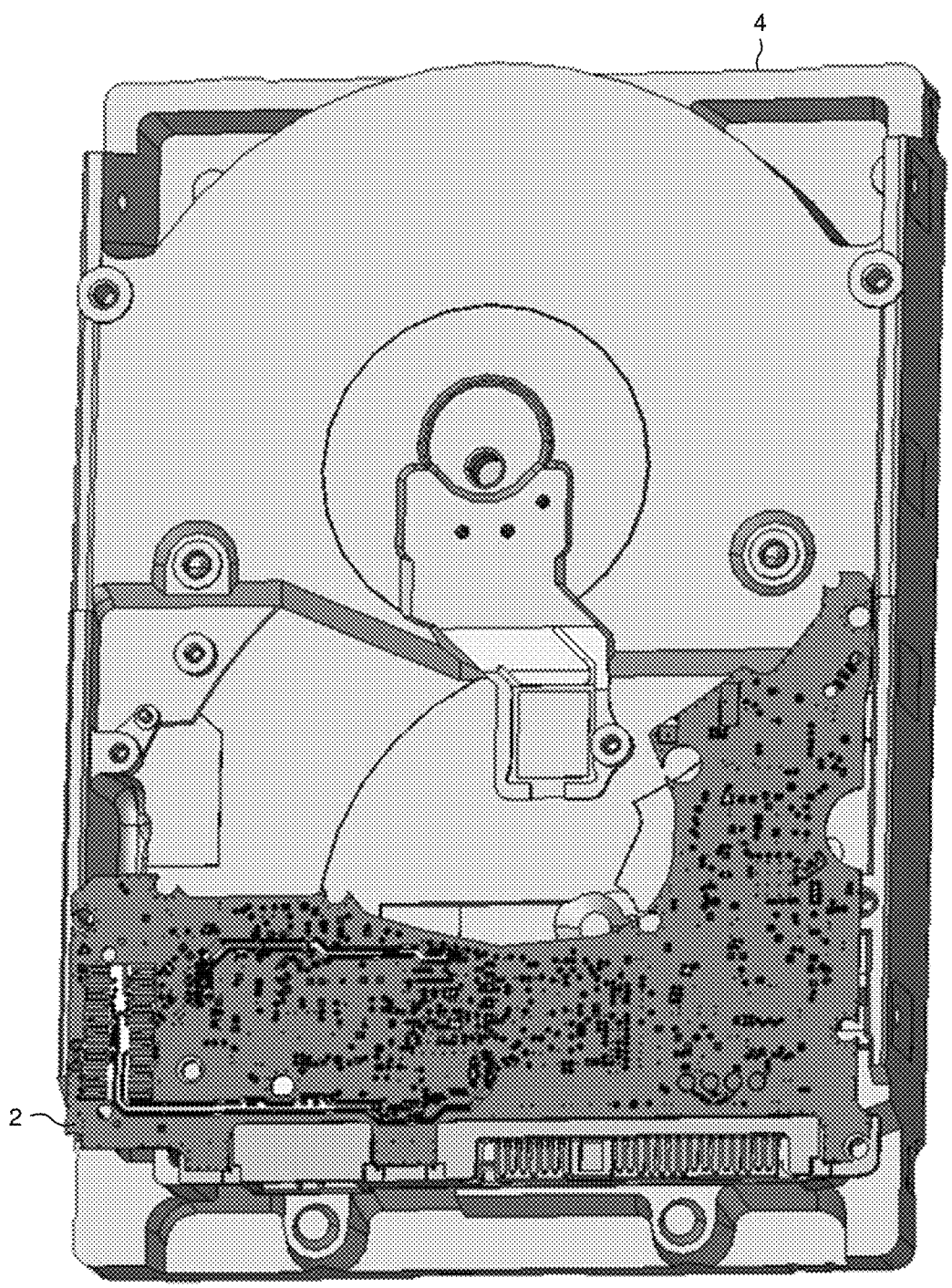
FIG. 1 shows a prior art data storage device in the form of a disk drive comprising a rigid PCB mounted to an outer surface of a base casting that houses a VCM, actuator arm assembly, and disks.
Figure 3A:
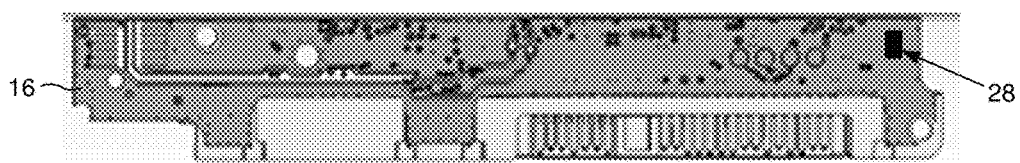
FIGS. 3A and 3B show an embodiment wherein a second PCB mounted to an external surface of the housing, wherein the second PCB comprises circuitry for communicating with a host.
Figure 3B:
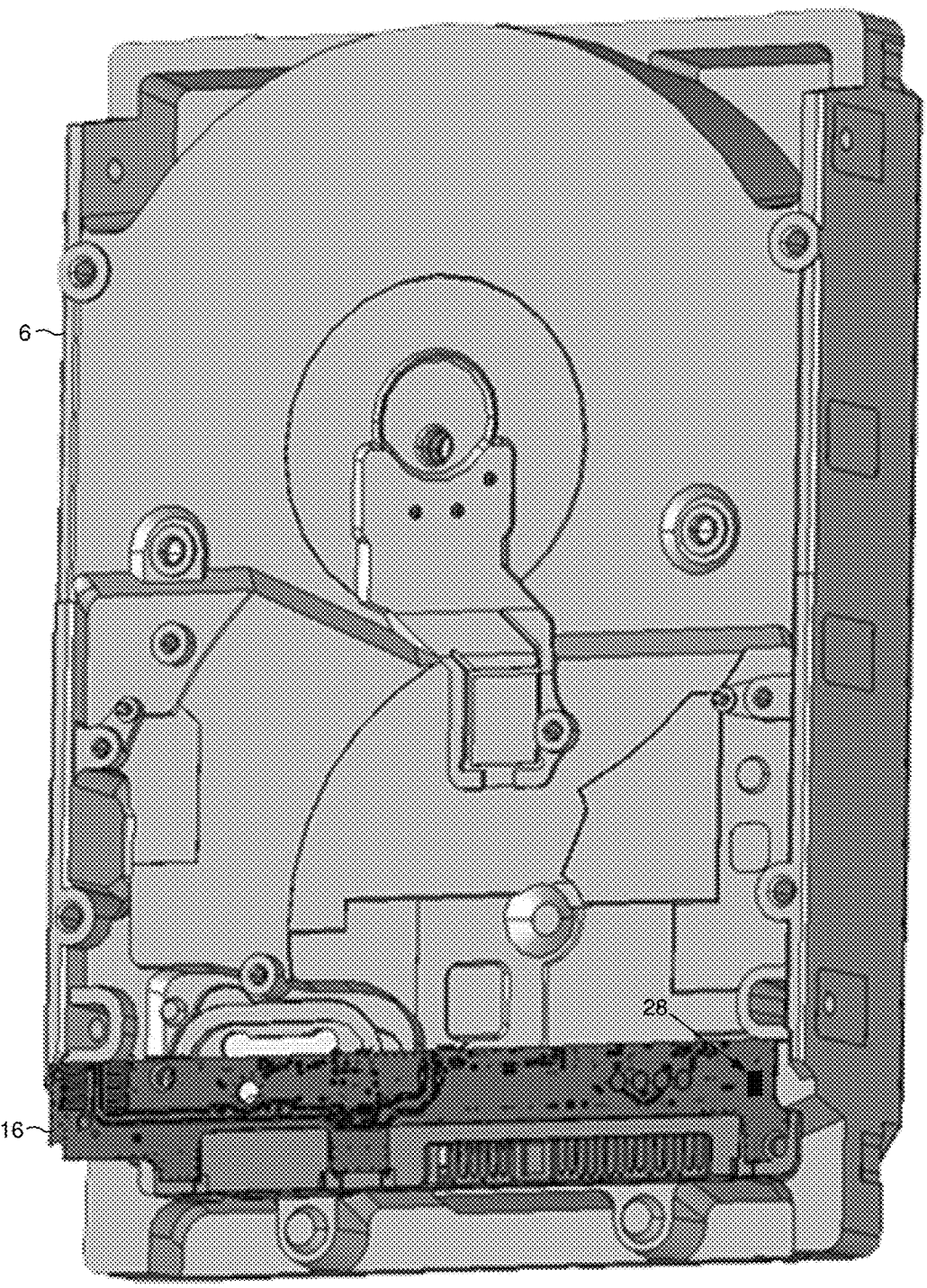

FIG. 3A shows an embodiment wherein a second PCB 16 comprises circuitry configured to communicate with a host (e.g., a Serial Advanced Technology Attachment (SATA) connector 18). FIG. 3B shows a perspective view of the bottom of the housing 6 with the second PCB 16 mounted thereon. Referring again to the embodiment of FIG. 2B, the first PCB 12 is electrically coupled to the second PCB 16 (FIG. 3B) using a suitable electrical cable 20 and connector assemblies. This embodiment enables one or more PCBs to be mounted within the housing 6 within the free space between the shroud 14 and the outer walls of the housing 6, for example, at one or both of the upper left corner and/or upper right corner of the housing 6 (upper right corner in the embodiment of FIG. 2B). In this manner, one or more integrated circuits that are conventionally mounted on the PCB externally mounted to the housing (e.g., as shown in FIG. 1) may instead be mounted on a PCB that is mounted internally inside the housing proximate to (or forming part of) the shroud 14.

The curved PCB 12 such as shown in FIG. 2A may be fabricated from any suitable material as a substrate, such as any suitable polyimide, polymeric, plastics, liquid crystalline polymer materials, as well as being fabricated as a single, dual, or multi-layer construct with conductive vias. In addition, the curve of the PCB 12 may be formed using any suitable technique, such as by injection molding the substrate, or by heating the substrate to enable bending the substrate into the curved shape (before or after mounting the circuitry to the PCB). In an alternative embodiment, the substrate of the PCB 12 may be fabricated from a flexible material so that the PCB 12 may be bent into the curved shape when installed into the housing 6. The curved PCB 12 may also comprise any suitable connector assembly 22 for coupling to the cable 20 which in turn couples to the external PCB 16 (FIG. 3B). In addition, the curved PCB 12 may be coupled to the cable 20 before, during, or after being installed into the housing 6. In one embodiment, any suitable electronics may be mounted on a single side of the curved PCB 12, and in another embodiment, electronics may be mounted on both sides of the PCB 12.

Any suitable electronics may be mounted on the curved PCB 12, such as a first integrated circuit 13 comprising a microprocessor for executing the steps of a computer program in order to perform any suitable operation of the disk drive, such as servo control of the head 10 over the disk 8. The electronics may also include suitable read channel circuitry for demodulating the read signal emanating from the head 10 during read operations, wherein the read channel circuitry may be integrated with the first integrated circuit 13 or integrated into a separate integrated circuit. In one embodiment, a power large scale integrated (PLSI) circuit 24 may also be mounted onto the curved PCB 12 such as shown in FIG. 2A, wherein the PLSI 24 may include control circuitry for controlling one or more actuators for actuating the head 10 over the disk 8 (e.g., a VCM 11 as shown in FIG. 2B), or for controlling a spindle motor (not shown) configured to rotate the disk 8. In another embodiment, a capacitor 26 may be mounted on the curved PCB 12 such as shown in FIG. 2A, wherein the capacitor 26 may filter a power voltage received from a host for powering the first integrated circuit 13 and/or the second integrated circuit 24. In yet another embodiment, a non-volatile semiconductor memory integrated circuit (e.g., a NAND IC) may be mounted on the curved PCB 12 which may be used for any suitable purpose, such as storing cached data, relocated data, frequently accessed data, etc.

In one embodiment, the capacitor 26 mounted on the curved PCB 12 may induce a vibration of the PCB 12 due to filtering the power voltage at particular frequencies (e.g., a resonant frequency). Referring again to FIG. 1, the capacitor 26 has conventionally been mounted to the external PCB 2 together with a suitable rotational vibration (RV) sensor configured to sense a rotational vibration affecting the disk drive, wherein a write operation may be aborted when an excessive rotation vibration is detected. However, the vibration induced by the capacitor 26 may be detected as a false rotational vibration by the RV sensor causing write operations to be aborted unnecessarily. Accordingly in one embodiment, the capacitor 26 is mounted on the internal curved PCB 12 such as shown in FIG. 2A, and one or more RV sensors 28 are mounted on the external PCB 16 such as shown in FIG. 3A. In this manner, a vibration caused by the capacitor 26 does not affect the operation of the RV sensor(s) 28 since they are fabricated on separate PCBs.

Figure 4:
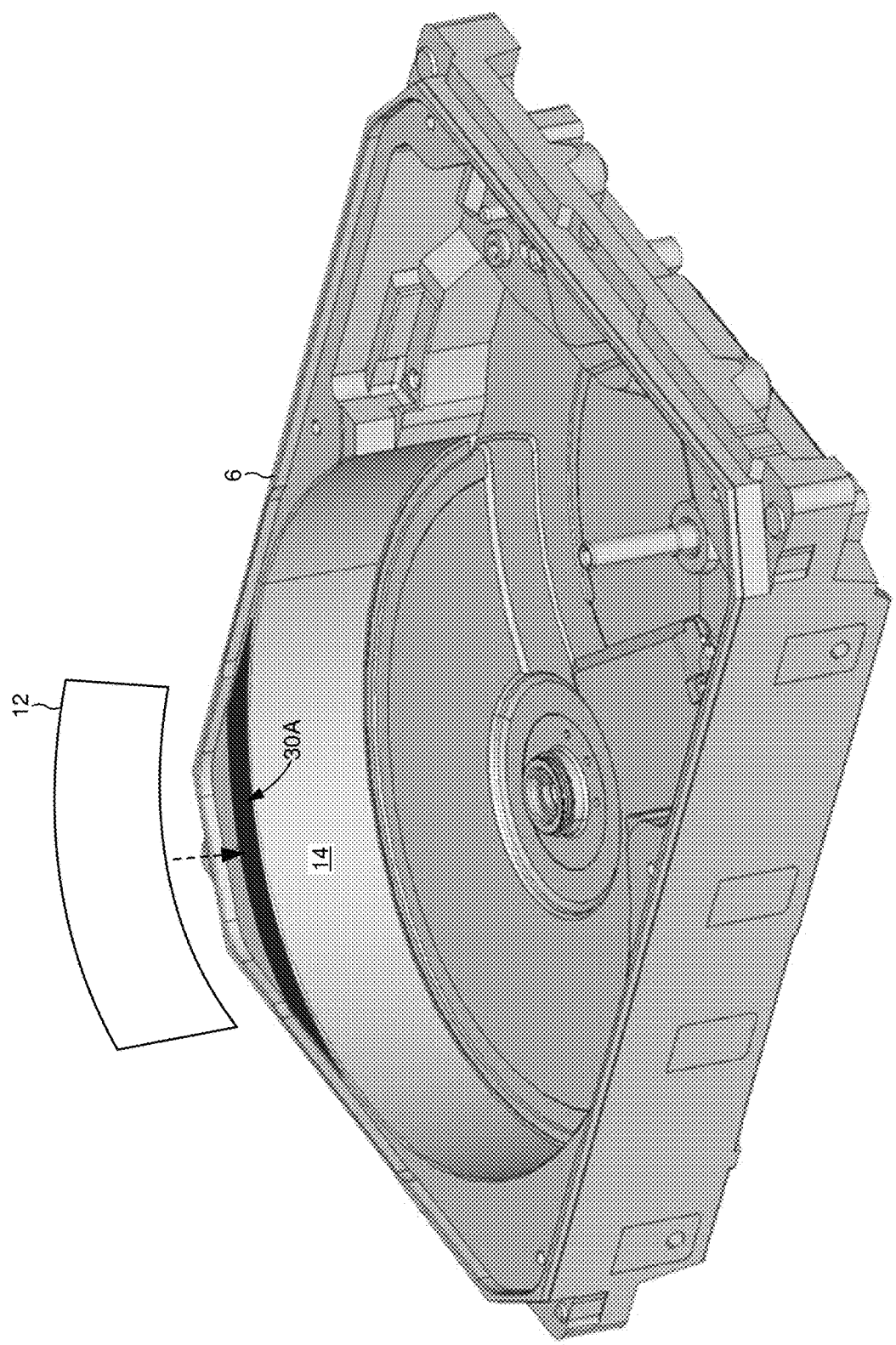
FIG. 4 shows an embodiment wherein the first curved PCB is inserted into a cavity of an upper right corner of the housing at least partially formed by an outer surface of the shroud.

FIG. 4 shows a top perspective view of the housing 6 with the cover removed and before installing the disk, VCM, and head stack assembly. In this embodiment, a shroud 14 is formed in the base casting of the housing 6 using any suitable techniques (e.g., injection molding) and any suitable materials (e.g., metal or plastic). A cavity 30A is formed in the base casting of the housing 6, wherein the curved PCB 12 is installed into the cavity 30A. In one embodiment, the curved PCB 12 may be coupled to the shroud 14, for example, the shroud 14 may comprise suitable guide slots for receiving each end of the curved PCB 12. In one embodiment, the curved PCB 12 is a flexible PCB that is bent into the curved shape when installed into the guide slots, wherein the flexed PCB 12 provides a spring retention force when released. In another embodiment, the curved PCB 12 may be coupled to a side of the housing within the cavity 30, for example, using suitable guide slots within the cavity 30A. In another embodiment, the curved PCB 12 may be flexed when installed into the cavity 30A, wherein the ends of the PCB 12 may be spring biased against the side of the housing 6 when the PCB 12 is released. In one embodiment, the ends of the curved PCB 12 may comprise electrical contact pads for coupling to electrical contact pads fabricated in the housing 6 (e.g., within guide slots of the shroud 14 or a wall of the housing 6), wherein the contact pads couple the curved PCB 12 to the end of the cable 20 or to a second curved PCB in an embodiment described below with reference to FIG. 6.

Figure 5:
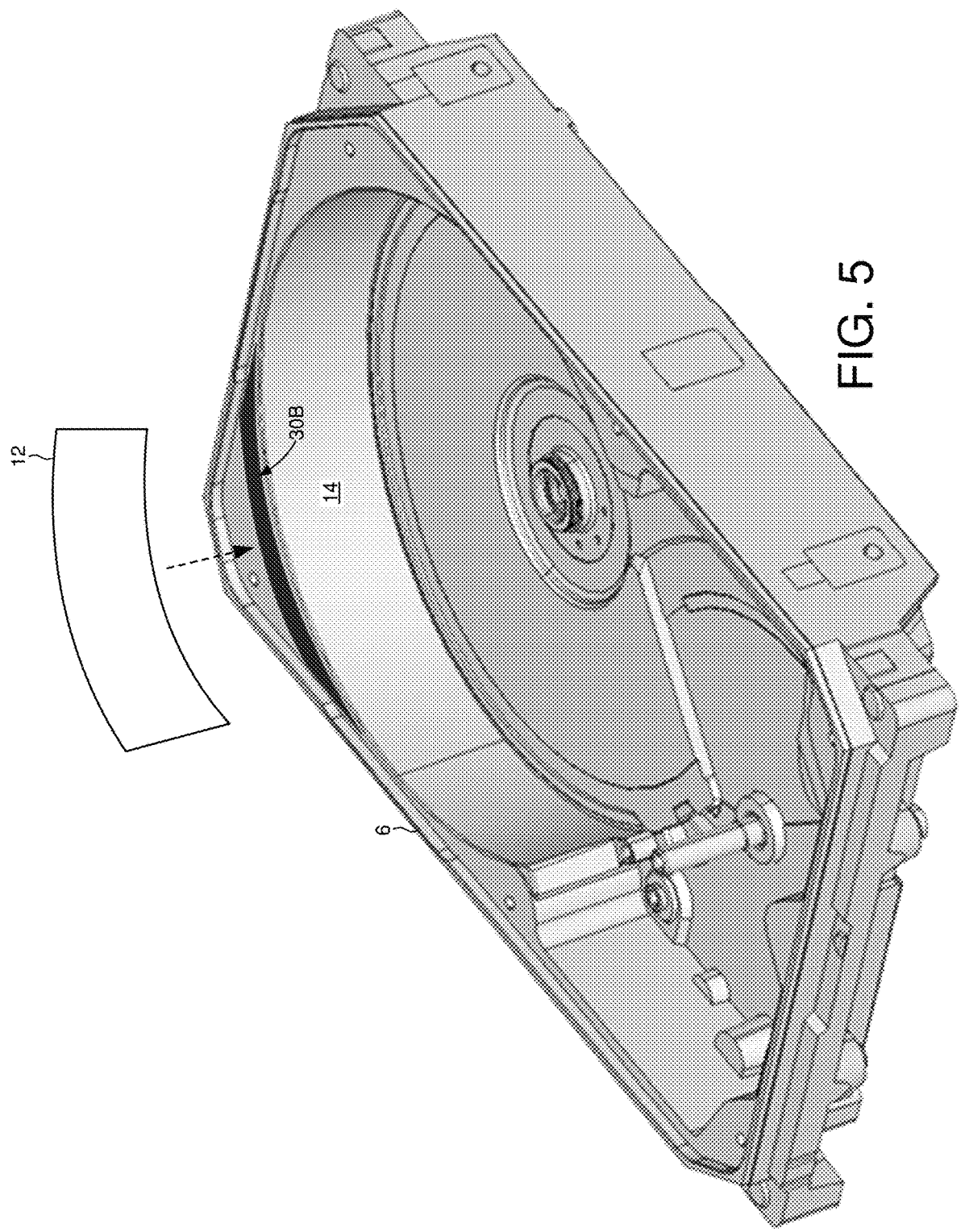
FIG. 5 shows an embodiment wherein the first curved PCB is inserted into a cavity of an upper left corner of the housing at least partially formed by an outer surface of the shroud.
Figure 6:
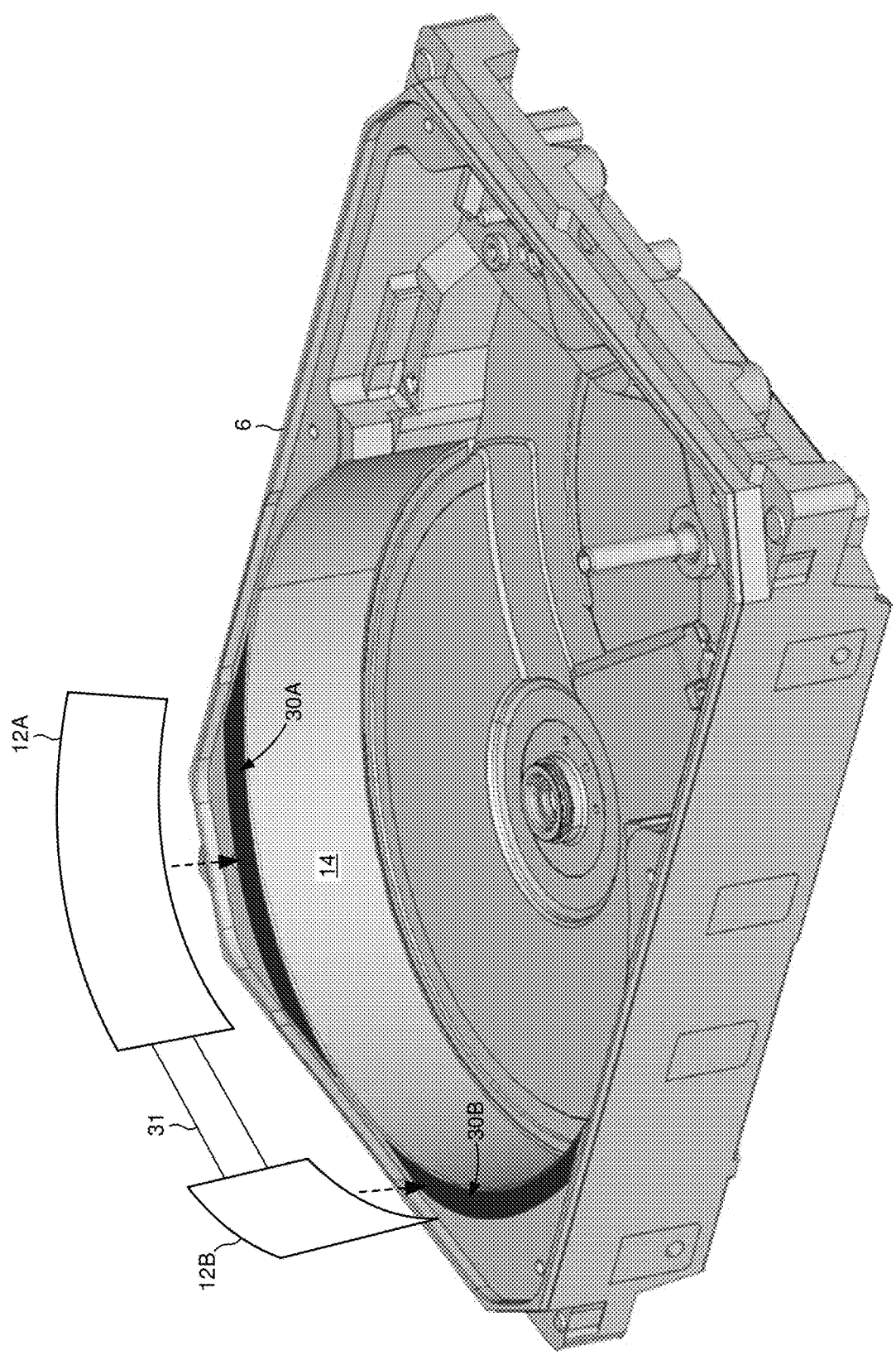
FIG. 6 shows an embodiment wherein a first curved PCB is inserted into a cavity of an upper left corner of the housing and is electrically coupled to a second PCB inserted into a cavity of an upper right corner of the housing.

FIG. 5 shows an alternative embodiment wherein a cavity 30B for inserting the curved PCB 12 is formed in an upper left corner of the housing 6 instead of the upper right corner of the housing 6 as in the embodiment of FIG. 4. FIG. 6 shows yet another embodiment wherein a first curved PCB 12A may be inserted into a first cavity 30A formed in the upper right corner of the housing 6, and a second curved PCB 12B may be inserted into a second cavity 30B formed in the upper left corner of the housing 6, wherein a suitable cable 31 (e.g., a flex cable) electrically couples the first curved PCB 12A to the second curved PCB 12B, thereby coupling together the electronics of both PCBs as well as coupling the electronics of both PCBs to the external PCB 16 of FIG. 3B. In one embodiment, the disk drive may comprise multiple disks concurrently accessed using respective heads, for example, using a split actuator configuration wherein respective VCMs actuate respective banks of actuator arms about a common pivot. In this embodiment, the second curved PCB 12B may have mounted thereon a second integrated circuit comprising a second microprocessor configured to actuate a second head over a second disk in order to access the second disk.

In yet another embodiment, multiple curved PCBs may be inserted into a cavity of the housing 6, such as inserting two curved PCBs into the cavity 30A, wherein the two curved PCBs may be arranged in a stacked configuration similar to an embodiment described below with reference to FIG. 8. For example, a first curved PCB may be coupled to the shroud 14 (e.g., spring biased against guide slots of the shroud), and a second curved PCB may be coupled to the wall of the housing 6 (e.g., spring bias against the wall or guide slots of the wall), wherein the first and second PCBs may be coupled together electrically, as well as both coupled to the external PCB 16 via the cable 20.

Figure 7A:
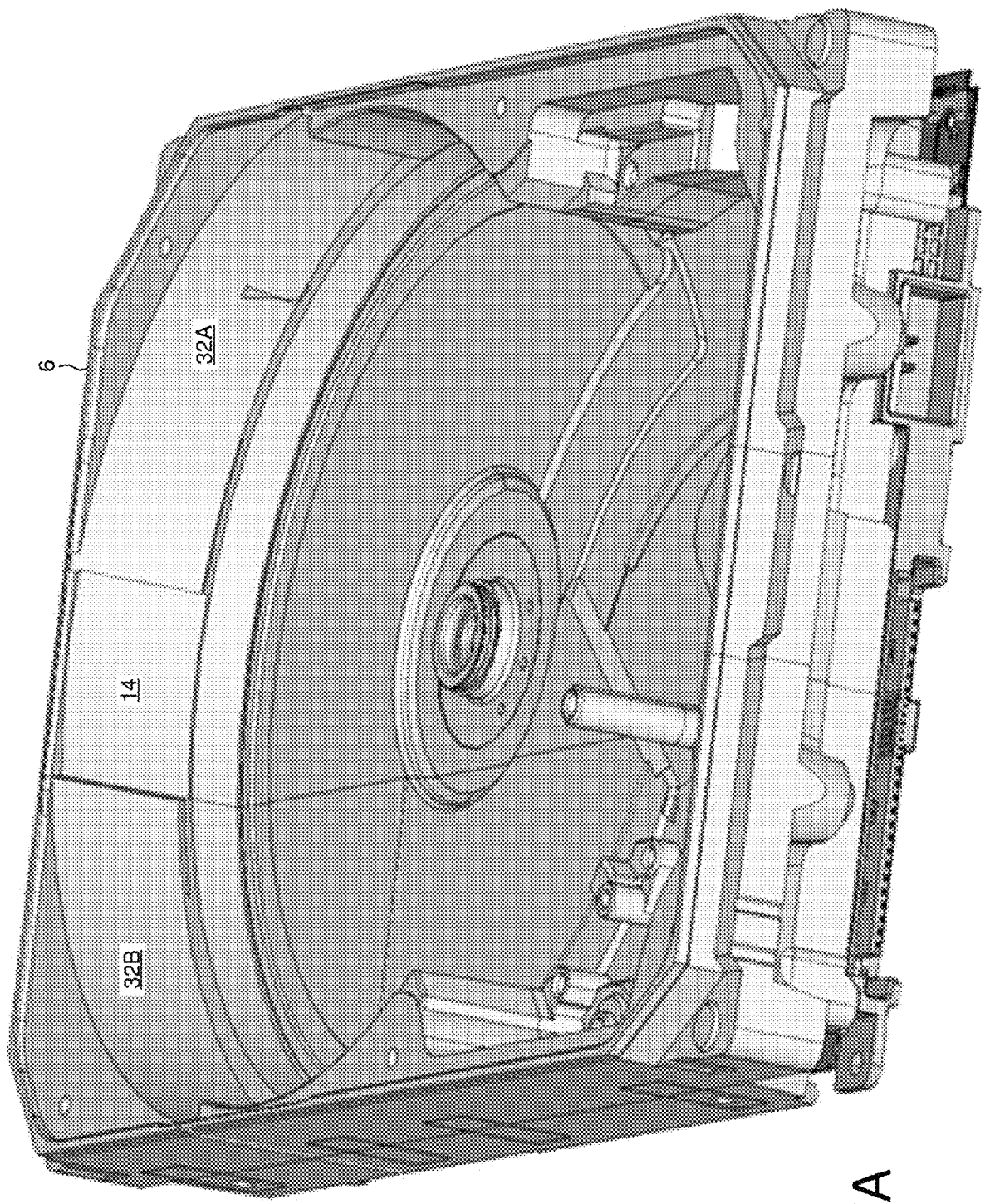
FIG. 7A shows an embodiment wherein the shroud comprises at least one cutout configured to receive the first curved PCB or an assembly of the first curved PCB.
Figure 7B:
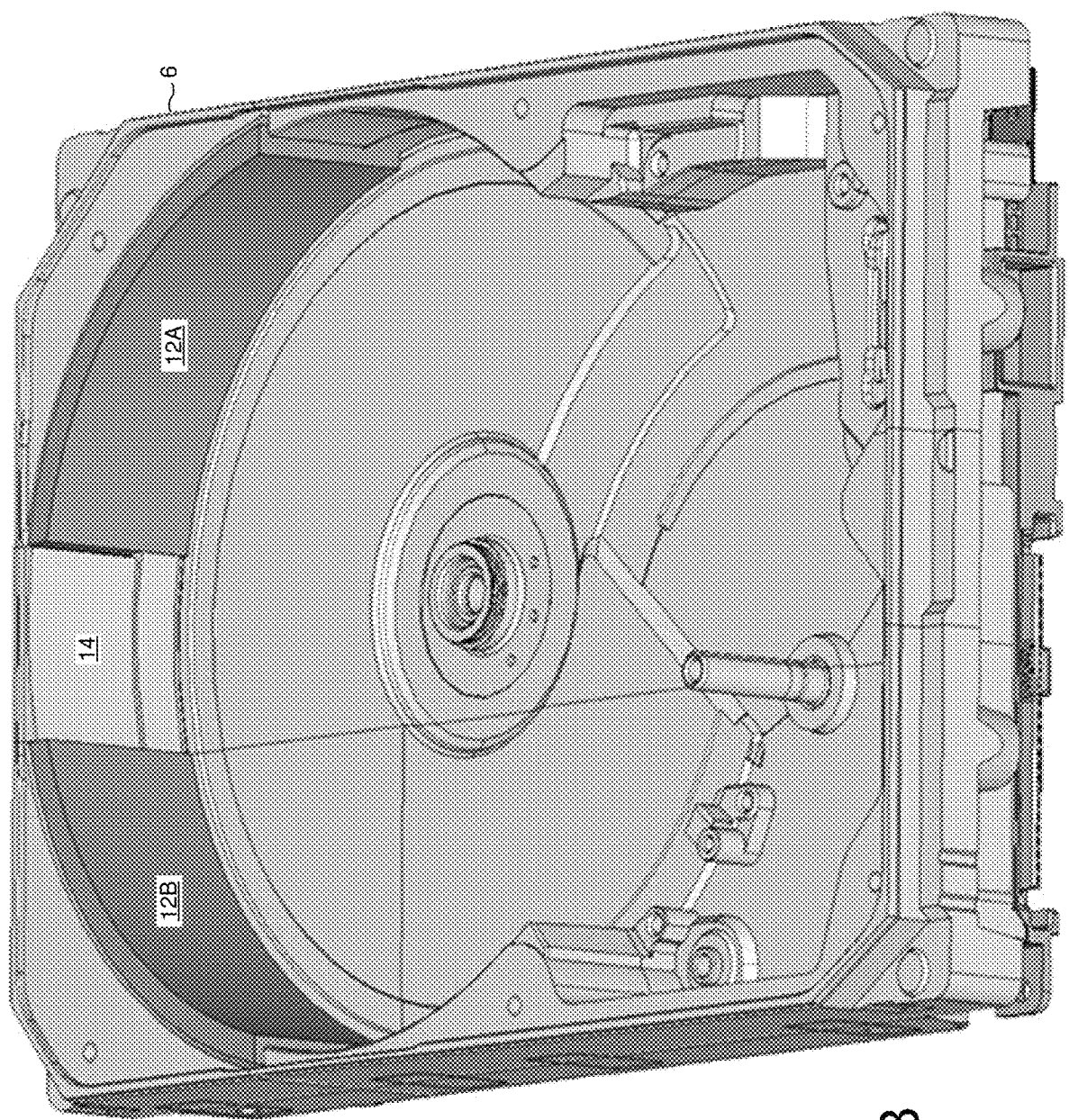
FIG. 7B shows an embodiment wherein first and second curved PCBs (or curved PCB assemblies) are installed into respective cutouts in the shroud.

FIG. 7A shows an embodiment wherein the shroud 14 may comprise one or more cutouts (e.g., cutouts 32A and 32B) configured to receive a curved PCB or an assembly of a curved PCB. FIG. 7B shows an embodiment wherein first and second curved PCBs or assemblies of curved PCBs 12A or 12B are installed into the respective cutouts 32A and 32B of the shroud 14. For example, in one embodiment the interior side of the curved PCB (the curved substrate) may form at least part of the shroud as shown in FIG. 7B, wherein the electrical components may be mounted on the exterior side of the curved PCB. In another embodiment, the curved PCBs may be installed into curved assemblies (e.g., curved cartridges for housing the curved PCBs), wherein the curved assemblies may be installed into the cutouts 32A and 32B of the shroud 14.

Figure 8:
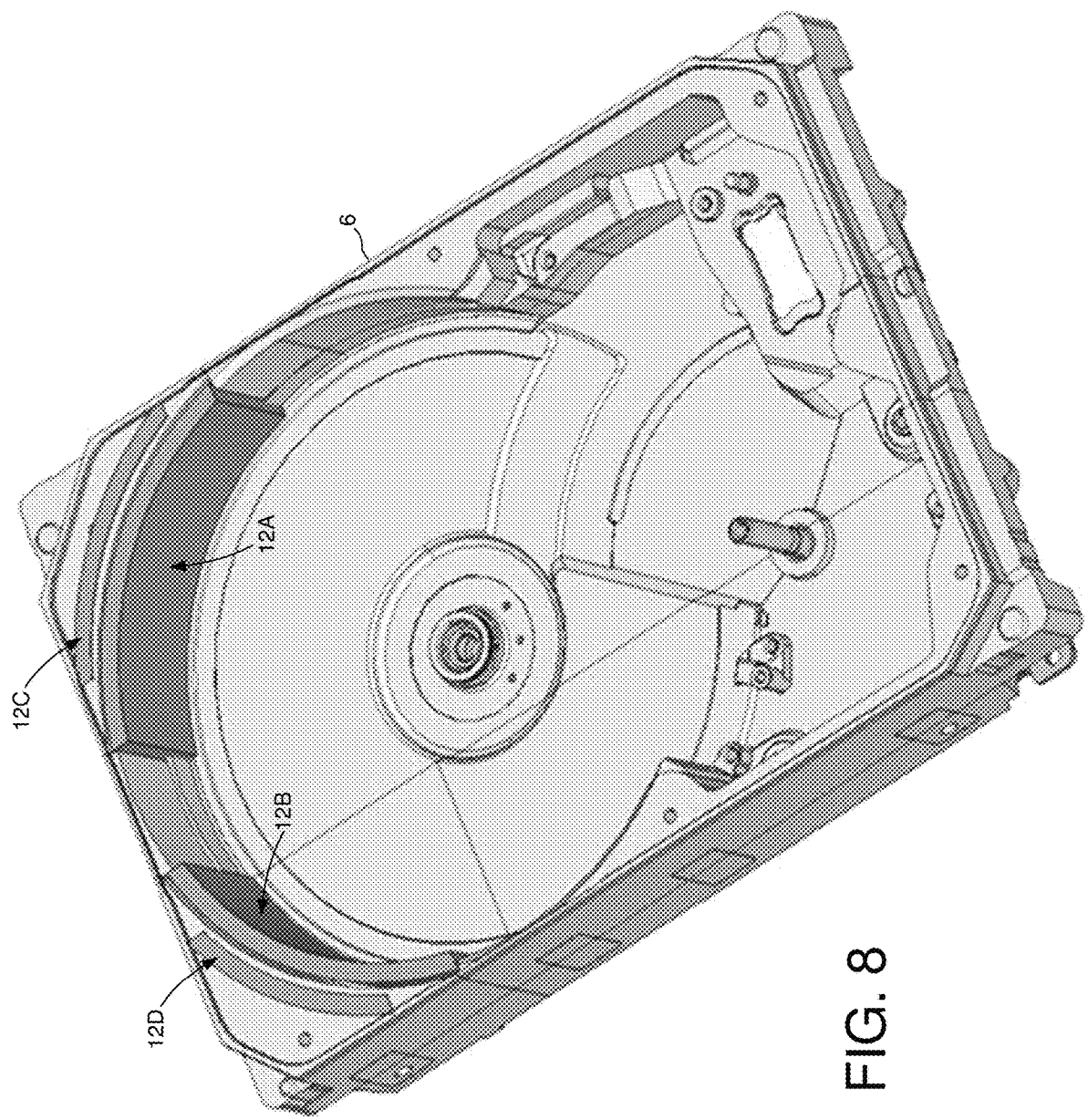
FIG. 8 shows an embodiment wherein multiple curved PCBs may be stacked in at least one of the upper left or upper right corner of the housing.

FIG. 8 shows an embodiment wherein multiple curved PCBs may be installed in a stacked configuration in either or both the upper left and/or upper right corner of the housing 6. In the example of FIG. 8, stacked curved PCBs 12A-12D are installed in each of the upper left and upper right corner of the housing 6, wherein in one embodiment all of the curved PCBs are electrically coupled together as well as electrically coupled to the external PCB 16 via the cable 20.

The various features and processes described above may be used independently of one another, or may be combined in various ways. All possible combinations and subcombinations are intended to fall within the scope of this disclosure. In addition, certain method, event or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the embodiments disclosed herein.

What is claimed is:

1. A data storage device comprising a base casting forming a housing, wherein components within the housing comprise:
   a first disk;
   a first head; and
   a first printed circuit board (PCB) being curved to substantially follow an arc of a first part of a shroud that surrounds at least part of the first disk, wherein the first PCB having mounted thereon a first integrated circuit comprising a first microprocessor configured to actuate the first head over the first disk in order to access the first disk.

2. The data storage device as recited in claim 1, wherein the first PCB is coupled to an outer surface of the shroud.

3. The data storage device as recited in claim 1, wherein the first PCB is coupled to a side of the housing.

4. The data storage device as recited in claim 1, wherein the first PCB comprises a substrate that forms at least part of the shroud.

5. The data storage device as recited in claim 1, wherein:
   the first PCB is inserted into an arcuate cartridge installed into the housing; and
   the arcuate cartridge forms at least part of the shroud when installed into the housing.

6. The data storage device as recited in claim 1, further comprising:
   a second disk;
   a second head; and
   a second PCB being curved to substantially follow an arc of a second part the shroud, wherein:
      the second PCB having mounted thereon a second integrated circuit comprising a second microprocessor configured to actuate the second head over the second disk in order to access the second disk; and
      the second PCB is electrically coupled to the first PCB.

7. The data storage device as recited in claim 1, further comprising:
   a second disk;
   a second head; and
   a second PCB being curved to substantially follow the arc of the first PCB, wherein:
      the second PCB is installed into the housing about an outer periphery of the first PCB;
      the second PCB having mounted thereon a second integrated circuit comprising a second microprocessor configured to actuate the second head over the second disk in order to access the second disk; and
      the second PCB is electrically coupled to the first PCB.

8. The data storage device as recited in claim 1, further comprising a second PCB mounted to an external surface of the housing, wherein the second PCB comprises circuitry for communicating with a host.

9. The data storage device as recited in claim 8, wherein:
   the first PCB has mounted thereon a capacitor configured to filter a power voltage for powering the first integrated circuit; and
   the second PCB having mounted thereon a rotational vibration sensor configured to detect a rotational vibration affecting the data storage device.

10. A data storage device comprising:
    a base casting forming a housing; and
    a first printed circuit board (PCB) mounted to an external surface of the housing, wherein the first PCB having mounted thereon a rotational vibration sensor configured to detect a rotational vibration affecting the data storage device,
    wherein components within the housing comprise:
       a first disk;
       a first head; and
       a second PCB electrically coupled to the first PCB, wherein the second PCB having mounted thereon:
          a first integrated circuit comprising a first microprocessor configured to actuate the first head over the first disk in order to access the first disk; and
          a capacitor configured to filter a power voltage received from a host, wherein the capacitor is capable of inducing a vibration of the second PCB.

11. The data storage device as recited in claim 10, wherein the first PCB comprises circuitry for communicating with a host.

12. A data storage device comprising:
    a base casting forming a housing; and
    a first printed circuit board (PCB) mounted to an external surface of the housing, wherein the first PCB having mounted thereon a rotational vibration sensor configured to detect a rotational vibration affecting the data storage device,
    wherein components within the housing comprise:
       a first disk;
       a first head; and
       a second PCB electrically coupled to the first PCB, wherein the second PCB having mounted thereon a first integrated circuit comprising a first microprocessor configured to actuate the first head over the first disk in order to access the first disk, wherein the second PCB is curved to substantially follow an arc of a first part of a shroud that surrounds at least part of the first disk.

13. The data storage device as recited in claim 12, wherein the second PCB is coupled to an outer surface of the shroud.

14. The data storage device as recited in claim 12, wherein the second PCB is coupled to a side of the housing.

15. The data storage device as recited in claim 12, wherein the second PCB comprises a substrate that forms at least part of the shroud.

16. The data storage device as recited in claim 12, wherein:

the second PCB is inserted into an arcuate cartridge installed into the housing; and the arcuate cartridge forms at least part of the shroud when installed into the housing.

17. The data storage device as recited in claim 12, further comprising:

a second disk;

a second head; and a third PCB being curved to substantially follow an arc of a second part the shroud, wherein:

the third PCB having mounted thereon a second integrated circuit comprising a second microprocessor configured to actuate the second head over the second disk in order to access the second disk; and the third PCB is electrically coupled to the second PCB.

18. The data storage device as recited in claim 12, further comprising:

a second disk;

a second head; and a third PCB being curved to substantially follow the arc of the second PCB, wherein:

the third PCB is installed into the housing about an outer periphery of the first PCB;

the third PCB having mounted thereon a second integrated circuit comprising a second microprocessor configured to actuate the second head over the second disk in order to access the second disk; and the third PCB is electrically coupled to the second PCB.

19. A data storage device comprising a base casting forming a housing, wherein components within the housing comprise:

a disk;

a head;

an actuator configured to actuate the head over the disk; and a first printed circuit board (PCB) being curved to substantially follow an arc of a first part of a shroud that surrounds at least part of the disk, wherein the first PCB having mounted thereon an integrated circuit configured to control the actuator.

20. The data storage device as recited in claim 19, wherein the actuator comprises a voice coil motor.

* * * * *